(12) United States Patent
Ding et al.

(10) Patent No.: US 10,678,043 B2
(45) Date of Patent: Jun. 9, 2020

(54) DISPLAY PANEL, DISPLAY DEVICE AND METHOD FOR CONTROLLING THE SAME

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Pengpeng Wang, Beijing (CN); Ping Zhang, Beijing (CN); Yanling Han, Beijing (CN); Chih Jen Cheng, Beijing (CN); Wei Liu, Beijing (CN); Xueyou Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/945,058

(22) Filed: Apr. 4, 2018

(65) Prior Publication Data

US 2019/0086659 A1    Mar. 21, 2019

(30) Foreign Application Priority Data

Sep. 20, 2017 (CN) .......................... 2017 1 0851607

(51) Int. Cl.
  *G02F 1/133* (2006.01)
  *G02B 26/00* (2006.01)
  (Continued)

(52) U.S. Cl.
  CPC .......... *G02B 26/004* (2013.01); *G01S 7/4811* (2013.01); *G01S 17/08* (2013.01); *G01S 17/36* (2013.01); *G02F 1/13318* (2013.01); *G02F 1/133514* (2013.01); *G02F 1/133524* (2013.01); *G02F 1/133526* (2013.01); *H01L 25/167* (2013.01); *H01L 27/156* (2013.01); *H01L 27/322* (2013.01); *H01L 27/3227* (2013.01);
  (Continued)

(58) Field of Classification Search
  CPC .................................................. G02F 1/13318
  See application file for complete search history.

(56) References Cited

U.S. PATENT DOCUMENTS

| 2008/0247743 | A1* | 10/2008 | Liang | ..................... G03B 15/06 396/175 |
| 2017/0176818 | A1* | 6/2017 | Shi | ......................... G02F 1/1362 |
| 2018/0366504 | A1* | 12/2018 | Jin | .......................... G01S 17/36 |

FOREIGN PATENT DOCUMENTS

| CN | 104583804 A | 4/2015 |
| CN | 105705964 A | 6/2016 |

(Continued)

OTHER PUBLICATIONS

First Office Action for Chinese Patent Application No. 201710851607.4 dated Dec. 20, 2019.

*Primary Examiner* — Edmond C Lau
(74) *Attorney, Agent, or Firm* — Calfee, Halter & Griswold LLP

(57) ABSTRACT

The present disclosure relates to a display panel, a device and a method for controlling the same. The display panel includes: a substrate; a detecting light transmitter, a detecting light receiver, a first optical element and a second optical element which are disposed on the substrate. The first optical element is configured to diverge light emitted from the detecting light transmitter and the second optical element is configured to converge the reflected divergent light to the detecting light receiver.

20 Claims, 6 Drawing Sheets

(51) Int. Cl.
*G02F 1/1335* (2006.01)
*H01L 27/32* (2006.01)
*H01L 51/52* (2006.01)
*H01L 27/15* (2006.01)
*H01L 33/58* (2010.01)
*H01L 31/16* (2006.01)
*G01S 17/08* (2006.01)
*G01S 7/481* (2006.01)
*G01S 17/36* (2006.01)
*H01L 25/16* (2006.01)
*G01S 17/89* (2020.01)
*G02F 1/29* (2006.01)

(52) U.S. Cl.
CPC .............. *H01L 31/16* (2013.01); *H01L 33/58* (2013.01); *H01L 51/5262* (2013.01); *G01S 17/89* (2013.01); *G02F 1/29* (2013.01); *G02F 2001/294* (2013.01); *G02F 2201/52* (2013.01); *G02F 2203/11* (2013.01); *H01L 27/3211* (2013.01); *H01L 27/3234* (2013.01); *H01L 51/5275* (2013.01)

(56) References Cited

FOREIGN PATENT DOCUMENTS

| | | |
|---|---|---|
| CN | 105940669 A | 9/2016 |
| CN | 107121803 A | 9/2017 |

* cited by examiner

DISPLAY PANEL, DISPLAY DEVICE AND METHOD FOR CONTROLLING THE SAME

CROSS-REFERENCE TO RELATED APPLICATIONS

The present application claims the priority of Chinese Patent Application No. 201710851607.4, filed on Sep. 20, 2017, and the entire contents thereof are incorporated herein by reference as part of the present application.

TECHNICAL FIELD

The present disclosure relates to display technology field, in particular, to a display panel, a display device and a method for controlling the same.

BACKGROUND

With the development of the binocular imaging technology and the intelligent hardware technology, installation of a camera for binocular vision on a display electronic device such as a television may enable an image display electronic device to be capable of sensing depth information of an object, thereby realizing functions of the electronic device such as motion control and the like.

The binocular imaging technology is to capture the same object with two cameras simultaneously, and subsequently to analyze the feature points of the two images captured by the two cameras, such that the depth image information of the object can be obtained.

SUMMARY

The present disclosure primarily provides a technical solution as follows.

According to an aspect, an embodiment of the present disclosure provides a display panel, including:

a substrate;

a detecting light transmitter, a detecting light receiver, a first optical element and a second optical element which are disposed on the substrate;

wherein the first optical element is configured to diverge light emitted from the detecting light transmitter;

the second optical element is configured to converge the reflected divergent light to the detecting light receiver.

According to another aspect, an embodiment of the present disclosure provides a display device including a display panel which includes:

a substrate;

a detecting light transmitter, a detecting light receiver, a first optical element and a second optical element which are disposed on the substrate;

wherein the first optical element is configured to diverge light emitted from the detecting light transmitter;

the second optical element is configured to converge the reflected divergent light to the detecting light receiver.

According to still another aspect, an embodiment of the present disclosure provides a method for controlling a display panel which includes the following steps:

a first trigger instruction is received, the detecting light transmitter and the detecting light receiver is turned on according to the received first trigger instruction, depth information is measured on an external object according to a phase difference between the light emitted from the detecting light transmitter and the light received by the detecting light receiver.

According to still another aspect, an embodiment of the present disclosure provides a method for controlling a display panel. In the display panel, the first optical element includes a first liquid crystal lens unit, the second optical element includes a second liquid crystal lens unit, and the first liquid crystal lens unit and the second liquid crystal lens unit are electrically connected with a lens driving unit; the first liquid crystal lens unit has a concave lens state that is driven and adjusted by the lens driving unit, and the second liquid crystal lens unit has a convex lens state that is driven and adjusted by the lens driving unit; the detecting light transmitter emits detecting light by detecting light point in the light emitting area of first area of the substrate and the detecting light receiver receives the reflected detecting light by detecting light point in the light receiving area of the first area; the first area is disposed with a pixel unit for displaying images, and the pixel unit for displaying images in the first area is electrically connected with a screen film transistor driving unit; the first liquid crystal lens unit has a flat lens state that is driven and adjusted by the lens driving unit and the second liquid crystal lens unit has a flat lens state that is driven and adjusted by the lens driving unit; the substrate includes a second area; the second area is disposed with a pixel unit for displaying images, and the pixel unit for displaying images in the second area is electrically connected with the screen film transistor driving unit.

The method includes the following steps:

a second trigger instruction is received, the first and second liquid crystal lens units are driven into the flat lens state according to the received second trigger instruction;

the pixel unit in the first area and the pixel unit in the second area are driven to image.

The above description is merely a summary for the technical solutions of the present disclosure. In order to facilitate to more clearly understand the technical means and implement the technical means in accordance with the content of the specification, the preferred embodiments of the present disclosure below will be described in connection with the drawings.

BRIEF DESCRIPTION OF THE DRAWINGS

The various advantages and benefits will be apparent for those skilled in the art after reading the detailed description of the preferred embodiments. The drawings are merely for the purpose of illustration of the preferred embodiments, but shall not be deemed as limitations to the present disclosure. In all drawings, the same reference number refers to the same component, where.

DETAILED DESCRIPTION

In order to facilitate to describe the technical means and efficacy employed by the present disclosure for achieving the intended purpose, the specific implementation, structure, feature and function of the display panel, the device and the method for controlling the same according to the present disclosure will be described below in detail in connection with the drawings and the preferred embodiments. In the following description, "an embodiment" or "the embodiment" described in different sentences may not refer to the same embodiment. In addition, the specific features, structures or characteristics in one or more embodiments may be combined in any suitable manner.

In a display panel provided by the embodiment, a detecting light transmitter may emit light to an external object and the emitted light can be received by a detecting light receiver when reflected by the external object, thereby the display panel can measure the depth information on the external object according to the phase difference between the light emitted from the detecting light transmitter and the light received by the detecting light receiver.

Figure 1:
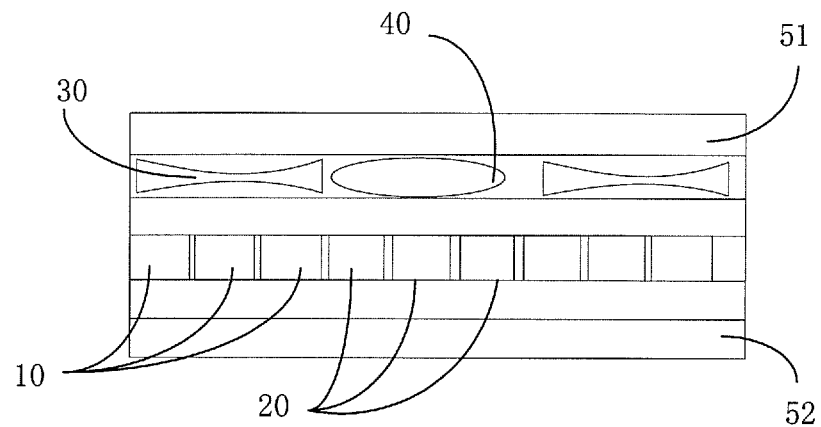
FIG. 1 is a schematic diagram illustrating a structure of a display panel according to an embodiment of the present disclosure.

FIG. 1 is an embodiment of a display panel provided by the present disclosure. Referring to FIG. 1, a display panel provided by an embodiment of the present disclosure may be applied to a display device. The display panel may include: a substrate; a detecting light transmitter 10, a detecting light receiver 20, a first optical element 30 and a second optical element 40 which are disposed on the substrate. The first optical element 30 is configured to diverge light emitted from the detecting light transmitter and the second optical element 40 is configured to converge the reflected divergent light to the detecting light receiver.

The detecting light transmitter and the detecting light receiver are integrated on the substrate such that the display panel may have a function of a time of flight (TOF) camera. The display panel with the function of the time of flight camera has good performance for measuring depth information compared with the display electronic device with the binocular imaging technology. Meanwhile, the time of flight camera may utilize less resources and this may reduce the requirement for hardware of a display device.

Figure 2:
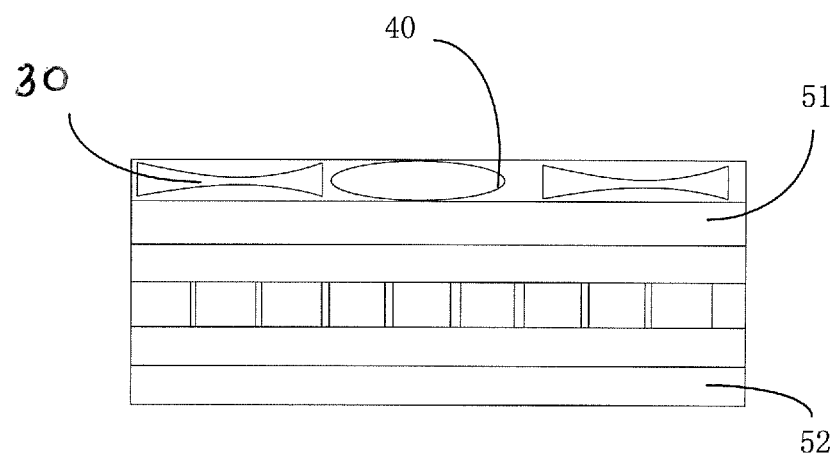
FIG. 2 is a schematic diagram illustrating a structure of a display panel according to another embodiment of the present disclosure.

As shown in FIG. 1, the substrate may generally include an upper substrate 51 and a lower substrate 52. The upper substrate and the lower substrate are disposed opposite to each other. The upper substrate 51 may be fabricated by a transparent panel such as a tetrafluoroethylene panel or a glass panel and the lower substrate may include a glass substrate or a flexible material substrate. When the lower substrate is a glass substrate, the lower substrate is generally applied to a conventional liquid crystal display (LCD), but there is no limitation thereto. When the lower substrate is a flexible material substrate, the lower substrate may be applied to a flexible display. The detecting light transmitter 10, the detecting light receiver 20, the first optical element 30 and the second optical element 40 are disposed between the upper substrate 51 and the lower substrate 52, and the first optical element 30 and the second optical element 40 are disposed on the inside surface of the upper substrate 51. The inside surface of the upper substrate is a side of the upper substrate that closes to the lower substrate and the inside surfaces of the upper substrate 51 and the lower substrate 52 are disposed opposite to each other. The inside surface of the lower substrate is a side of the lower substrate that closes to the upper surface. As shown in FIG. 2, the first optical element 30 and the second optical element 40 may also be located outside the upper substrate 51 and the lower substrate 52 or on the outside surface of the upper substrate 51. The outside surface of the upper substrate is a side of the upper substrate that is away from the lower substrate and the outside surface and the inside surface of the upper substrate are disposed opposite to each other.

The detecting light transmitter may be an infrared transmitter including an infrared lamp and a driving circuit. The driving circuit may drive the infrared transmitter to emit a light pulse. The detecting light receiver may be an infrared receiver (i.e., an infrared sensor) which receives the reflected infrared light emitted from the infrared lamp.

As shown in FIG. 1, the first optical element 30 may include a solid-state concave lens unit which is placed on a light emitting side of the detecting light transmitter 10. The second optical element 40 may include a solid-state convex lens unit which is placed on a light receiving side of the detecting light receiver 20. The solid-state concave lens unit and the solid-state convex lens unit may be formed of polymer materials, but there is no limitation thereto. The area where the solid-state concave lens unit and the solid-state convex lens unit are is the area of the display panel for measuring depth information. The depth information measurement area and the display area of the display panel may be located in different areas and the solid-state concave lens unit and the solid-state convex lens unit may not affect the display area to display. For example, the depth information measurement area may be located on the top and bottom of the display panel.

In another embodiment, the first optical element and the second optical element may also employ an element such as a grating, an optical aperture or the like to substitute the solid-state concave lens unit and the solid-state convex lens unit.

Figure 3:
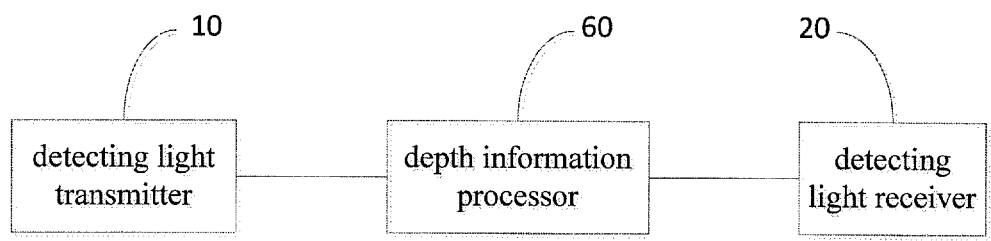
FIG. 3 is a schematic diagram illustrating an electrical connection structure inside a display panel according to an embodiment.

A depth information processor may or not be disposed on the substrate, as shown in FIG. 3, the depth information processor 60 may be electrically connected with the detecting light transmitter 10 and the detecting light receiver 20 and used for measuring depth information on an external object according to a phase difference between the light emitted from the detecting light transmitter 10 and the reflected divergent light received by the detecting light receiver 20. Specifically, the three-dimension information of the external object may be sensed with TOF. Since the depth information can be measured based on the TOF technique, the used algorithms are simplified, less resources may be utilized and the requirement for hardware of the depth information processor is lowered in comparison with the binocular imaging technology in prior art.

Figure 4:
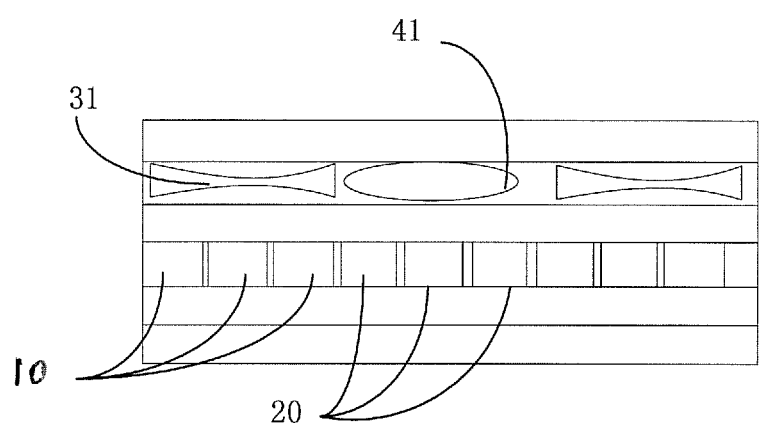
FIG. 4 is a schematic diagram illustrating a structure of a display panel according to still another embodiment of the present disclosure.
Figure 5:
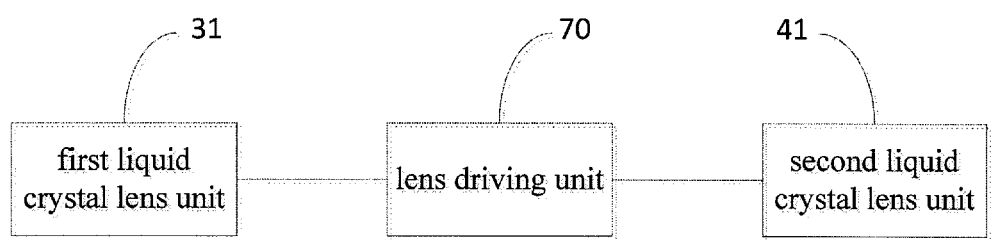
FIG. 5 is a schematic diagram illustrating an electrical connection structure inside a display panel according to another embodiment.

FIGS. 4 and 5 are embodiments of the display panels provided by the present disclosure. The difference between the display panels provided by the embodiment one and the present embodiment resides in that the first optical unit and the second optical unit do not employ the solid-state optical source element, but employ a liquid crystal optical element. In this embodiment, the liquid crystal optical element is driven to realize the diverging and converging functions thereof.

Referring to FIGS. 4 and 5, a display panel provided by an embodiment of the present disclosure may be applied to a display device. The display panel may include: a substrate; a detecting light transmitter 10, a detecting light receiver 20, a first optical element and a second optical element which are disposed on the substrate. The first optical element is configured to diverge light emitted from the detecting light transmitter 10 and the second optical element is configured to converge the reflected divergent light to the detecting light receiver 20. Specifically, the first optical element may include a first liquid crystal lens unit 31 and the second optical element may include a second liquid crystal lens unit 41. The first liquid crystal lens unit 31 and the second liquid crystal lens unit 41 are electrically connected with a lens driving unit 70. The first liquid crystal lens unit 31 has a concave lens state that is driven and adjusted by the lens driving unit 70, and the second liquid crystal lens unit 41 has a convex lens state that is driven and adjusted by the lens driving unit 70.

In the measurement of the depth information on the external object, the lens driving unit is controlled to adjust the first liquid crystal lens unit into the concave lens state and the second liquid crystal lens unit into the convex lens state, and then, the defecting light transmitter and the detecting light receiver are turned on. Thus the depth information on the external object can be measured according to a phase difference between the light emitted from the detecting light transmitter and the light received by the detecting light receiver.

Figure 5A:
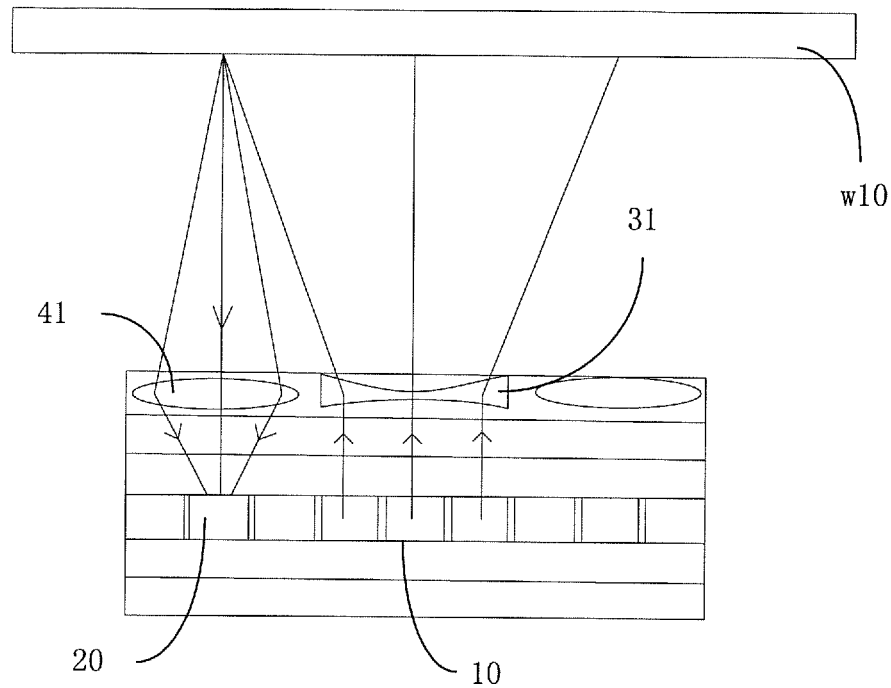
FIG. 5a is a schematic diagram illustrating an optical path diagram of the detecting light transmitter and the detecting light receiver during operation according to another embodiment of the present disclosure.

As shown in FIG. 5*a*, the first liquid crystal lens unit 31 may employ a liquid crystal controlling technology to adjust the state of the concave lens, so as to function as the concave lens and diverge the light emitted from the detecting light transmitter 10. The divergent light may be reflected by an external object w10 when reaching the external object w10. The second liquid crystal lens unit 41 may employ a liquid crystal controlling technology to adjust the state of the convex lens, so as to function as the convex lens. The part of the light reflected by the external object w10 may be reflected to the second liquid crystal lens unit and the reflected divergent light may be converged to the defecting light receiver 20 by the second liquid crystal lens unit which is in the convex lens state.

A area of a pixel unit for displaying images is arranged on the substrate as a display area of the display panel. In order to have the area where the first liquid crystal lens unit for diverging the light emitted from the detecting light transmitter and the second liquid crystal lens unit for converging the reflected divergent light to the detecting light receiver are located be a depth information measurement area of the display panel, the depth information measurement area and the display area of the display panel may be located at the different areas respectively. For example, the depth information measurement areas are located at the top and the bottom of the display panel, or the depth information measurement areas are located at both side of the display panel. The first liquid crystal lens unit in the concave lens state and the second liquid crystal lens unit in the convex lens state do not affect the display area to display.

Figure 6:
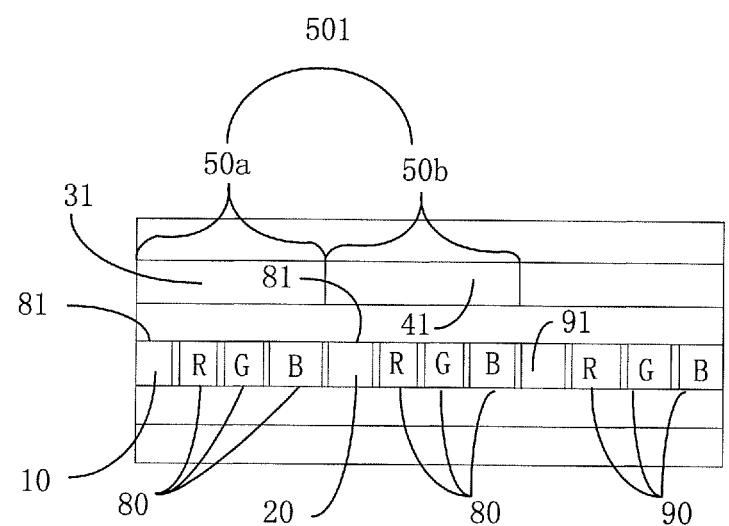
FIG. 6 is a schematic diagram illustrating a structure of an OLED display panel according to an embodiment of the present disclosure.
Figure 6A:
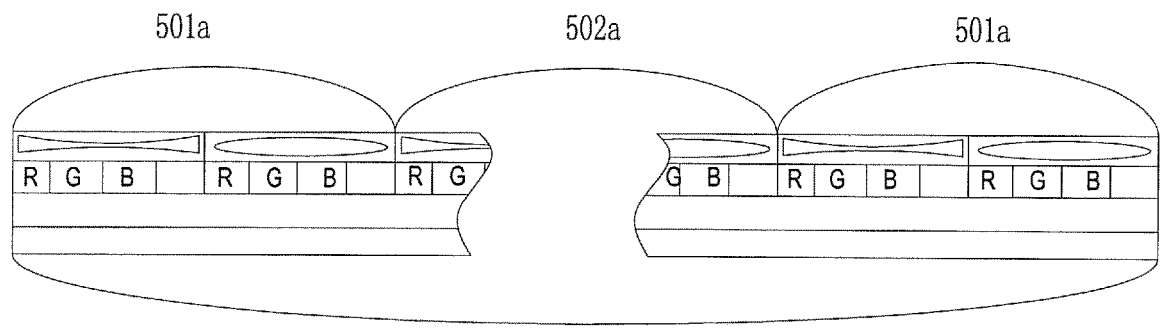
FIG. 6a is a schematic diagram illustrating a structure of partially overlapping a depth information measurement area with a portion of a display area in a display panel according to an embodiment of the present disclosure.
Figure 6B:
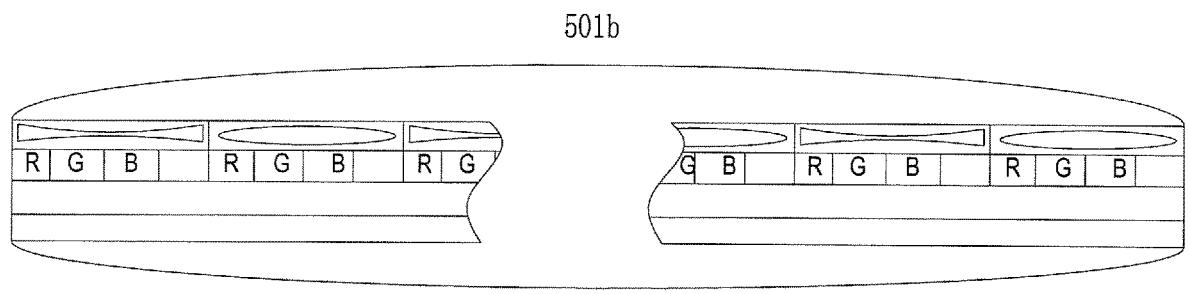
FIG. 6b is a schematic diagram illustrating a structure of entirely overlapping a depth information measurement area with a portion of a display area in a display panel according to an embodiment of the present disclosure.

The liquid crystal optical element may function as a flat lens and this takes the depth information measurement area and the display area of the display panel to be located at an overlapping area, as shown in FIG. 6. The detecting light transmitter 10 emits detecting light by detecting light point in the light emitting area 50*a* of first area 501 of the substrate and the detecting light receiver 20 receives the reflected detecting light by detecting light point in the light receiving area 50*b* of the first area 501. The first area is disposed with a pixel unit 80 for displaying images, and the pixel unit 80 for displaying images in the first area is electrically connected with a screen film transistor driving unit. The first liquid crystal lens unit 31 may also have a flat lens state that is driven and adjusted by the lens driving unit and the second liquid crystal lens unit 41 may also have a flat lens state that is driven and adjusted by the lens driving unit. The light emitting area 50*a* in the first area on the substrate is an area where the defecting light transmitter emits light and the light receiving area 50*b* in the first area on the substrate is an area where the detecting light receiver receives light. Specifically, the pixel unit in the first area may be arranged on the light emitting area and/or the light receiving area to constitute the entire or partial display area of the display panel, and the light emitting area and the light receiving area constitute the depth information measurement area of the display panel. The depth information measurement area of the display panel and the display area in the first area of the display panel are located at the overlapping area. The first liquid crystal lens unit is in the flat lens state such that light may pass through therein straight and may not be diverged. The second liquid crystal lens unit is in the flat lens state such that light may pass through therein straight and may not be converged. Further, when the liquid crystal optical element functions as the flat lens, the depth information measurement area and the display area may be located at an entirely or partially overlapping area, as shown in FIGS. 6*a* and 6*b* in detail. Referring to the drawings, in the case of locating at the partially overlapping area as shown in FIG. 6*a*, the depth information measurement area and the display area of the display panel are overlapped partially. The pixel units of the display panel are arranged at the first area 501*a* and the second area 502*a* of the display panel respectively and the first area 501*a* and the second area 502*a* of the display panel may constitute the display area 503*a* of the display panel. The first area 501*a* of the display panel constitutes the depth information measurement area of the display panel and the second area 502*a* of the display panel does not constitute the depth information measurement area of the display panel. In the case of locating at the entirely overlapping area, as shown in FIG. 6*b*, the depth information measurement area and the display area of the display panel are overlapped entirely and the pixel units of the display panel are arranged on the first area 501*b* of the display panel. The first area 501*b* of the display panel constitutes the display area 503*b* of the display panel and the first area 501*b* of the display panel also constitutes the depth information measurement area of the display panel. In the technical solution provided by the embodiment, both the first liquid crystal lens unit and the second liquid crystal lens unit have two modes. In the first mode, the first liquid crystal lens unit is in the concave lens state and the second liquid crystal lens unit is in the convex lens state. It is possible to enable the first area to measure depth information when the detecting light transmitter and the detecting light receiver are turned on. When there is no need to use the function for measuring the depth information, that is, in the second mode, the first liquid crystal lens unit is in a flat lens state and the second liquid crystal lens state is in a flat lens too. It is possible to enable the first area to display images when the pixel units for displaying images in the first area are turned on.

When the depth information measurement area and the display area of the display panel are located at the partially overlapping area, as shown in FIG. 6, the substrate may include a second area which is disposed with a pixel unit 90 for displaying images. The pixel unit 90 for display images in the second area is electrically connected with the screen film transistor driving unit.

In the technical solution provided by the embodiment, when there is no need to use the function for measuring the depth information, that is, in the second mode, the first liquid crystal lens unit is in a flat lens state and the second liquid crystal unit is also in a flat lens state. The pixel units for displaying images in the first and second areas can be driven by the screen film transistor driving unit at the same time to display images simultaneously. The first area and the second area can be adjacent to each other and the screens of the first and second areas may constitute image information. In other case, the first area and the second area can be spaced apart from each other.

In a specific embodiment, a defecting light point is disposed in the first area on the substrate. For different types of the display panels, the position of the defecting light point can be adjusted according to the different position of the depth information measurement areas. In other embodiment provided by the present disclosure, defecting light points are disposed in the pixel units of the first area and second area respectively. Although the second area does not have the function for measuring depth information, as shown in FIG. 6. The pixel unit in the second area is disposed with a detecting light point 91, thus this facilitates to manufacture and process thereto and improves commonality for manufacturing, and the defecting light transmitter or the defecting light receiver may be disposed in a pixel unit in any position according to actual needs to dispose the area for measuring depth information.

The image pixel points of the pixel unit 80 in the first area may include a red pixel R, a green pixel G and a blue pixel B. The image pixel points of the pixel unit 90 in the second area may include a red pixel R, a green pixel G and a blue pixel B. The arrangement of the red pixel R, the green pixel G, the blue pixel B and the detecting light point 81 of the pixel unit 80 in the first area is the same as the arrangement of the red pixel R, the green pixel G, the blue pixel B and the detecting light point 91 of the pixel unit 90 in the second area. When the first area and the second area operate to display simultaneously, they display an image or a screen collectively. In the case of which the arrangements of the three types of the pixel points in both areas are the same, the synchronization of the screens displayed by the two areas can be reached. For example, the red pixel, the green pixel, the blue pixel and the detecting light point of the pixel unit in the first area are arranged in a row sequentially, and the red pixel, the green pixel, the blue pixel and the detecting light point of the pixel unit in the second area are arranged in a row sequentially. Alternatively, the red pixel, the green pixel, the blue pixel and the detecting light point of the pixel unit in the first area are arranged in a ring sequentially and the red pixel, the green pixel, the blue pixel and the detecting light point of the pixel unit in the second area are arranged in a ring sequentially.

In some embodiment of the present disclosure, the display panel may be applied to an Organic Light-Emitting Diode (OLED, UIV OLED) organic electroluminescent display device. As shown in FIG. 6, the substrate includes a pixel layer, and the detecting light transmitter 10 and the detecting light receiver 20 are arranged on the pixel layer. The red pixel R includes a red pixel light emitting point, the green pixel G includes a green pixel light emitting point and the blue pixel B includes a blue pixel light emitting point. The detecting light transmitter 10 and the detecting light receiver 20 may be located in different pixel units and each pixel unit have four points, three of which are the color points and one of which is the light emitting point or light receiving point. The red pixel light emitting point, the green pixel light emitting point, the blue pixel light emitting point and the detecting light transmitter are located in the emitting pixel unit. The red pixel light emitting point, the green pixel light emitting point, the blue pixel light emitting point and the detecting light receiver are located in the receiving pixel unit. The detecting light transmitter and the detecting light receiver may be located in the same pixel unit. Each pixel unit have five points, three of which are the color points, one of which is the light emitting point and one of which is the light receiving point.

Figure 7:
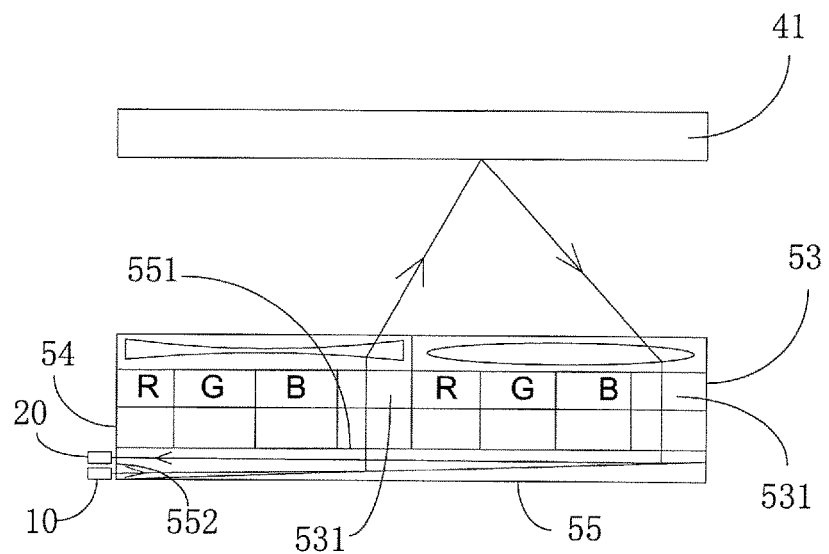
FIG. 7 is a schematic diagram illustrating a structure of a LED display panel according to an embodiment of the present disclosure.

In some embodiment of the present disclosure, the display panel may be applied to a Liquid Crystal Display (LCD). As show in FIG. 7, the substrate may include a color filter film 53, a liquid crystal layer 54 and a light guide plate 55 arranged in sequence. The detecting light point in the light emitting area of first area and the detecting light point in the light receiving area of the first area are detecting light transmitting points 531 formed on the color filter film 53. A first optical path surface 551 of the light guide plate 55 faces toward the liquid crystal layer 54, a second optical path surface 552 of the light guide plate 55 faces toward the detecting light transmitter 10 and the detecting light receiver 20, and the first optical path surface 551 and second optical path surface 552 of the light guide plate 55 are optically connected. The light guide plate includes a top surface, a bottom surface and a side surface. The first optical path surface of the light guide plate may be located on the side surface of the light guide plate and the second optical path surface of the light guide plate may be located on the top surface of the light guide plate. The bottom surface of the light guide plate may be disposed with a reflecting layer. The detecting light transmitter is located on the side surface of the light guide plate and emits light. The light enters into the light guide plate and is reflected by the reflecting layer on the bottom surface of the light guide plate to the top surface of the light guide plate, and then the light is reflected by the top surface to the first liquid crystal lens unit. That is to say, the light emitted from the detecting light transmitter may pass through the light guide plate, the liquid crystal layer, the color filter film and the first optical element in sequence and be reflected to an external object, the reflected light is reflected to the top surface of the light guide plate subsequently, and at this time, the light incident from the top surface of the light guide plate is reflected by the bottom surface of the light guide plate to the side surface of the light guide plate followed by passing through the side surface to arrive at the detecting light transmitter. That is to say, the reflected light may pass through the second optical element, the color filter film, the liquid crystal layer and the light guide plate in sequence and be received by the detecting light receiver. When the detecting light transmitter comprises an infrared transmitter, the detecting light transmitting point on the color filter film is an infrared filter point.

Figure 8:
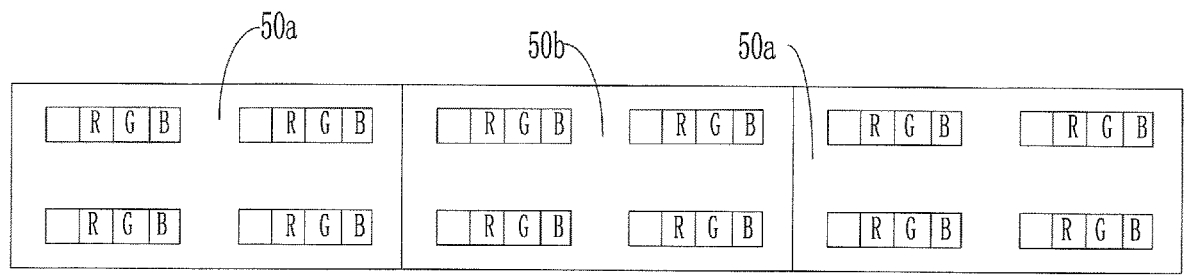
FIG. 8 is a schematic diagram illustrating an arrangement for a light emitting area and a light receiving area of a display panel according to an embodiment of the present disclosure.
Figure 9:
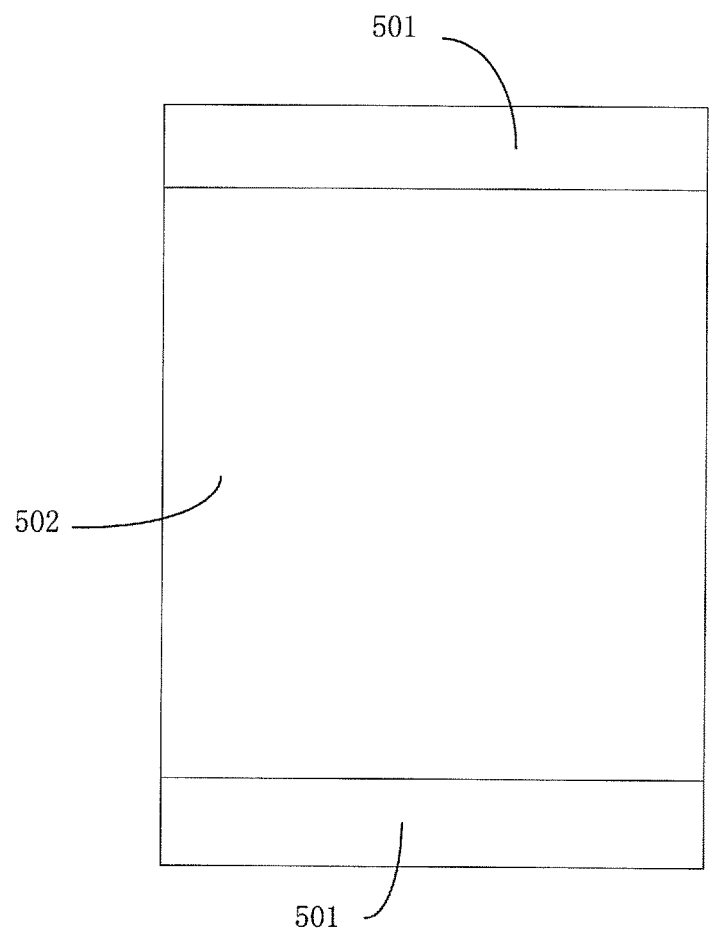
FIG. 9 is a schematic diagram illustrating an arrangement for a first area and a second area of a display panel according to an embodiment of the present disclosure.

Specifically, as shown in FIG. 8, the light emitting area 50a and the light receiving area 50b of the first area on the substrate may be spaced apart. As shown in FIG. 9, the second area 502 may be a rectangular area and the first area 501 may be located outside at least two opposite frames of the four frames of the second area 502. There may be a plurality of the detecting light transmitter and a plurality of the detecting light receiver. The plurality of the detecting light transmitter and the plurality of the detecting light receiver may be arranged in alternative. Arrangement of the first area outside the two opposite frames may provide a relative long light detecting distance for TOF and improve the effect for measuring the depth information by TOF.

The embodiment provides a display device including the display panel described in the above embodiments.

The display device may be any product or component having a display function such as a display panel, an electronic paper, a cell phone, a tablet computer, a television, a display, a notebook computer, a digital photo frame, a navigator or the like.

In the display device provided by the embodiment, the detecting light transmitter and the detecting light receiver are integrated on the substrate such that the display panel can have the function of the time of flight camera. The display panel with the function of the time of flight camera has good performance for measuring depth information compared with the display electronic device with the binocular imaging technology. Meanwhile, the time of flight camera may utilize less resources and this may reduce the requirement for hardware of a display device.

Figure 10:
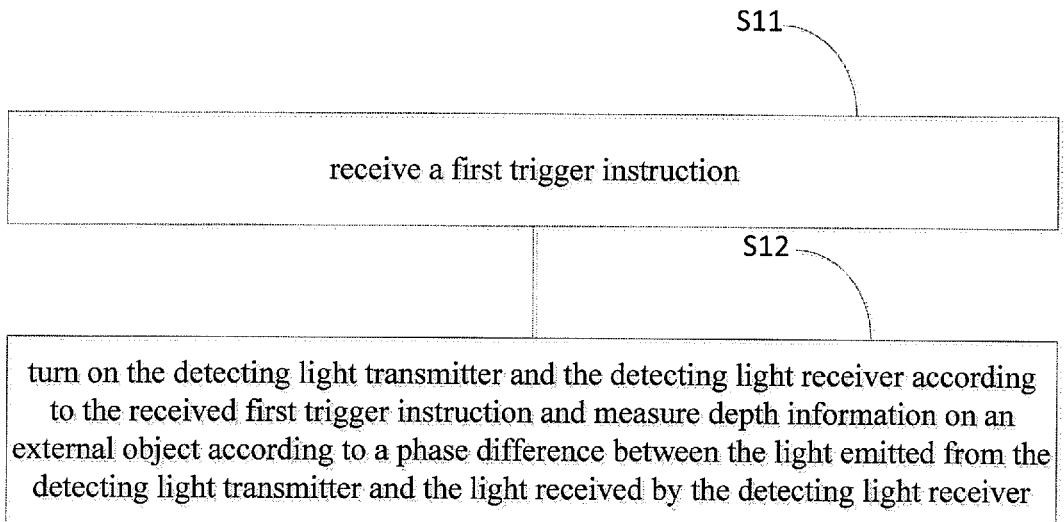
FIG. 10 is a flowchart illustrating a method for controlling a display panel according to an embodiment of the present disclosure.

FIG. 10 is an embodiment of a method for controlling the display panel according to the present disclosure. As shown in FIG. 10, the method for controlling the display panel provided by the above embodiment of the present disclosure may include the following steps.

S11: a first trigger instruction is received.

When it is need for the display panel to measure the depth information, the user may trigger the first trigger instruction to the display panel. The first trigger instruction may be triggered by transmitting the wireless signal or a button switch provided on the display panel and the present disclosure does not intend to limit thereto so long as the display panel can receive the first trigger instruction triggered by the user.

S12: the detecting light transmitter and the detecting light receiver are turned on according to the received first trigger instruction and depth information on an external object is measured according to a phase difference between the light emitted from the detecting light transmitter and the light received by the detecting light receiver.

The detecting light transmitter and the detecting light receiver operate simultaneously. The light emitted from the light transmitter is diverged by the first optical element and the reflected divergent light is converged to the detecting light receiver.

In the method for controlling the display panel provided by the embodiment, since the detecting light transmitter and the detecting light receiver are integrated on the substrate, the display panel can have the function of the time of flight camera. The display panel with the function of the time of flight camera has good performance for measuring depth information compared with the display electronic device with the binocular imaging technology. Meanwhile, the time of flight camera may utilize less resources and this may reduce the requirement for hardware of a display device.

Figure 11:
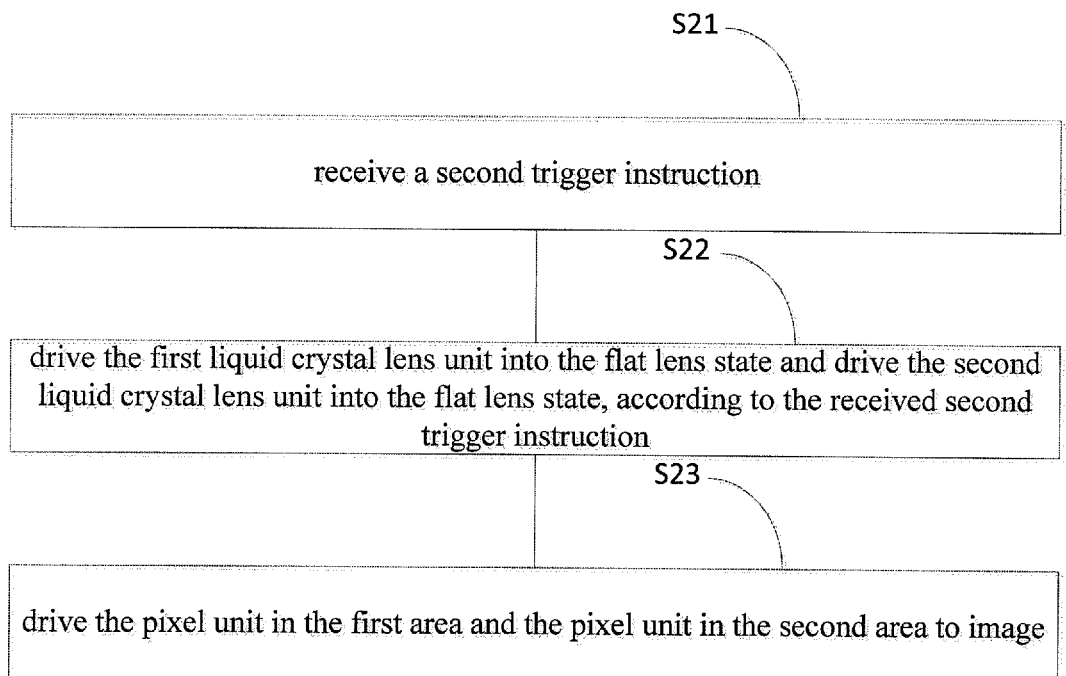
FIG. 11 is a flowchart illustrating a method for controlling a display panel according to another embodiment of the present disclosure.

FIG. 11 is an embodiment of a method for controlling a display panel provided by the present disclosure. As shown in FIG. 11, in the method for controlling the display panel provided by the above embodiment of the present disclosure.

Wherein, the display panel may include: a substrate; a detecting light transmitter, a detecting light receiver, a first optical element and a second optical element which are disposed on the substrate. The first optical element is configured to diverge light emitted from the detecting light transmitter and the second optical element is configured to converge the reflected divergent light to the detecting light receiver. Specifically, the first optical element includes a first liquid crystal lens unit, the second optical element includes a second liquid crystal lens unit, and the first liquid crystal lens unit and the second liquid crystal lens unit are electrically connected with a lens driving unit; the first liquid crystal lens unit has a concave lens state that is driven and adjusted by the lens driving unit, and the second liquid crystal lens unit has a convex lens state that is driven and adjusted by the lens driving unit. The detecting light transmitter emits detecting light by detecting light point in the light emitting area of first area of the substrate and the detecting light receiver receives the reflected detecting light by detecting light point in the light receiving area of the first area. The first area is disposed with a pixel unit for displaying images, and the pixel unit for displaying images in the first area is electrically connected with a screen film transistor driving unit. The first liquid crystal lens unit has a flat lens state that is driven and adjusted by the lens driving unit and the second liquid crystal lens unit has a flat lens state that is driven and adjusted by the lens driving unit. The substrate includes a second area. The second area is disposed with a pixel unit for displaying images, and the pixel unit for displaying images in the second area is electrically connected with the screen film transistor driving unit. The controlling method may include the following steps.

S21: a second trigger instruction is received.

When it is need for the display pane to display, the user may trigger a second trigger instruction. The second trigger instruction may be triggered by transmitting the wireless signal or a button switch provided on the display panel and the present disclosure does not intend to limit thereto so long as the display panel can receive the second trigger instruction triggered by the user.

S22: the first liquid crystal lens unit is driven into the flat lens state and the second liquid crystal lens unit is driven into the flat lens state, according to the received second trigger instruction.

S23: the pixel unit in the first area and the pixel unit in the second area are driven to image.

When it doesn't need to measure the depth information, the user may trigger the second trigger instruction to the display panel to enter into the second mode, such that the first liquid crystal lens unit is in the flat lens state and the second liquid crystal lens unit is in the flat lens state. After that, the pixel unit for displaying images in the first area and the pixel unit in the second area are turned on to image, the first liquid crystal lens unit in the flat lens state and the second liquid crystal lens unit in the flat lens state can transmit the light emitted from the pixel of the pixel unit and the first area and the second area can be used for displaying images. The first area has the functions for measuring depth information and displaying images.

In the above embodiment, the description of each embodiment emphasizes different aspect of the present disclosure and the parts of each embodiment that are not described in detail can refer to the related description in other embodiment.

It is appreciated that the related features of the above device can be referred to one another. In addition, the "first", the second" and the like in the above embodiment are used for distinguishing the respective embodiments but do not represent the advantages and the disadvantages of the embodiments.

In the specification herein, a large number of details are illustrated. However, it is appreciated that the embodiment of the present disclosure may be implemented without these details. In some embodiment, well known structures and techniques are not shown in detail so as to not obscure the understanding of this description.

Similarly, it is appreciated that, in order to simplify the present disclosure and facilitate to understand one or more aspects of the present invention, the feathers in the present disclosure may be grouped into one embodiment, figure, or description thereof in the above description of the exemplary embodiment of the present disclosure. However, the present disclosure does not intend to claim the claimed disclosure to encompass more features than those defined by claims. Definitely, as defined by the appended claims, the features of the claimed protecting scope are less than those disclosed in the above single embodiment, and each claim can be deemed as an individual embodiment of the present disclosure.

It is appreciated for those skilled in the art that the components in the device of the embodiment can be modified adaptively and can be disposed in one or more devices that are different form the device in this embodiment. The components of the embodiment can be combined into one component or be divided into a plurality of sub-components. In case of no conflict, all features and components in any disclosed device disclosed in the specification (including claims, abstract and drawings) can be combined in any suitable manner. Each feature in specification (including claims, abstract and drawings) can be replaced by the equivalent that is provided for the same or similar purpose, unless otherwise stated.

In addition, it is appreciated for those skilled in the art that although some embodiments described here include some features included in other embodiment, other combinations of the features in different embodiments shall be deem as other different embodiments which fall into the scope of the present disclosure. For example, in appended claim, any one of the embodiments to be protected can be combined in any suitable manner. The embodiment of the components in the present disclosure may be realized by hardware or combination thereof.

It is noted that the above description of the embodiment is for illustration but not for limitation to the present disclosure. The alternative embodiment can be designed by those skilled in the art without departing from the scope of the appended claims. In claims, any symbol in the parenthesis shall not be deemed as the limitation to the claim. The meaning of the term "include" or "comprise" does not exclude the presence of the part or component that is not listed in claim. The word such as "a" or "an" dose not exclude the meaning of presence of a plurality of such parts or components. The present disclosure may be realized by the device that includes several different components. In the claims that lists several parts, some of these parts can be embodied by the same component. The word such as "first", "second" or the like does not refer to any specific sequence and these words can be deemed as the name.

The above embodiments are merely preferred embodiments of the present disclosure, and it is not intent to limit to the present disclosure in any manner. Any simple modification and equivalent alternation according to the technical spirit of the present disclosure still fall into the scope of the technical solution of the present disclosure.

What is claimed is:

1. A display panel, comprising:
   a substrate, comprising a display area and a measurement area that are at least partially overlapped with each other;
   the display area is disposed with a pixel unit for displaying images; and
   the measurement area is disposed with a detecting light transmitter, a detecting light receiver, a first liquid crystal lens unit and a second liquid crystal lens unit,
   wherein the first liquid crystal lens unit is configured to: switch to a concave lens state in response to activation of a depth information measurement function and diverge light emitted from the detecting light transmitter, and switch to a flat lens state in response to inactivation of the depth information measurement function and cause light emitted from the pixel unit to pass through without being diverged;
   the second liquid crystal lens unit is configured to: switch to a convex lens state in response to activation of the depth information measurement function and converge reflected divergent light to the detecting light receiver, and switch to a flat lens state in response to inactivation of the depth information measurement function and cause light emitted from the pixel unit to pass through without being converged, the reflected divergent light being reflected from an external object receiving at least part of the light diverged by the first liquid crystal lens.

2. The display panel according to claim 1, further comprising:
   a depth information processor, electrically connected with the detecting light transmitter and the detecting light receiver respectively,
   wherein the depth information processor is configured to measure depth information on an external object according to a phase difference between the light emitted from the detecting light transmitter and the reflected divergent light received by the detecting light receiver.

3. The display panel according to claim 1, wherein
   the first liquid crystal lens unit and the second liquid crystal lens unit are electrically connected with a lens driving unit; and
   the first liquid crystal lens unit has the concave lens state being driven and adjusted by the lens driving unit, and the second liquid crystal lens unit has the convex lens state being driven and adjusted by the lens driving unit.

4. The display panel according to claim 3, wherein
   the measurement area comprises a light emitting area and a light receiving area, the detecting light transmitter emits detecting light through a detecting light point in the light emitting area, and the detecting light receiver receives reflected detecting light through a detecting light point in the light receiving area;
   the measurement area is also disposed with a pixel unit for displaying images, and the pixel unit for displaying images in the measurement area is electrically connected with a screen film transistor driving unit; and
the first liquid crystal lens unit has the flat lens state being driven and adjusted by the lens driving unit and the second liquid crystal lens unit has the flat lens state being driven and adjusted by the lens driving unit.

5. The display panel according to claim 4, wherein the pixel unit for displaying images in the display area is electrically connected with the screen film transistor driving unit.

6. The display panel according to claim 5, wherein the pixel unit in the display area is disposed with the detecting light point.

7. The display panel according to claim 6, wherein an image pixel point of the pixel unit in the measurement area comprises a red pixel, a green pixel and a blue pixel;
an image pixel point of the pixel unit in the display area comprises a red pixel, a green pixel and a blue pixel; and
arrangement of the red pixel, the green pixel, the blue pixel and the detecting light point of the pixel unit in the measurement area is the same as that of the pixel unit in the display area.

8. The display panel according to claim 4, wherein the substrate comprises a pixel layer, and the detecting light transmitter and the detecting light receiver are arranged on the pixel layer.

9. The display panel according to claim 8, wherein the detecting light transmitter and the detecting light receiver are disposed on detecting light points of different pixel units in the measurement area respectively.

10. The display panel according to claim 4, wherein the substrate comprises: a color filter film, a liquid crystal layer and a light guide plate arranged in sequence;
the detecting light point in the light emitting area of the measurement area and the detecting light point in the light receiving area of the measurement area are detecting light transmitting points formed on the color filter film; and
a first optical path surface of the light guide plate faces toward the liquid crystal layer, a second optical path surface of the light guide plate faces toward the detecting light transmitter and the detecting light receiver, and the first optical path surface and second optical path surface of the light guide plate are optically connected.

11. The display panel according to claim 10, wherein the detecting light transmitter comprises an infrared transmitter; and
the detecting light transmitting point on the color filter film is an infrared filter point.

12. The display panel according to claim 1, wherein the first optical element comprises a solid-state concave lens unit and the second optical element comprises a solid-state convex lens unit.

13. The display panel according to claim 2, wherein the first liquid crystal lens unit and the second liquid crystal lens unit are electrically connected with a lens driving unit; and
the first liquid crystal lens unit has the concave lens state being driven and adjusted by the lens driving unit, and the second liquid crystal lens unit has the convex lens state being driven and adjusted by the lens driving unit.

14. The display panel according to claim 2, wherein the first optical element comprises a solid-state concave lens unit and the second optical element comprises a solid-state convex lens unit.

15. A display device, comprising a display panel which comprises:
a substrate, comprising a display area and a measurement area that are at least partially overlapped with each other;
the display area is disposed with a pixel unit for displaying images; and
the measurement area is disposed with a detecting light transmitter, a detecting light receiver, a first liquid crystal lens unit and a second liquid crystal lens unit,
wherein the first liquid crystal lens unit is configured to: switch to a concave lens state in response to activation of a depth information measurement function and diverge light emitted from the detecting light transmitter, and switch to a flat lens state in response to inactivation of the depth information measurement function and cause light emitted from the pixel unit to pass through without being diverged;
the second liquid crystal lens unit is configured to: switch to a convex lens state in response to activation of the depth information measurement function and converge reflected divergent light to the detecting light receiver, and switch to a flat lens state in response to inactivation of the depth information measurement function and cause light emitted from the pixel unit to pass through without being converged, the reflected divergent light being reflected from an external object receiving at least part of the light diverged by the first liquid crystal lens.

16. The display device according to claim 15, further comprising:
a depth information processor electrically connected with the detecting light transmitter and the detecting light receiver,
wherein the depth information processor is configured to measure depth information on an external object according to a phase difference between the light emitted from the detecting light transmitter and the reflected divergent light received by the detecting light receiver.

17. The display device according to claim 15, wherein the first liquid crystal lens unit and the second liquid crystal lens unit are electrically connected with a lens driving unit; and
the first liquid crystal lens unit has the concave lens state being driven and adjusted by the lens driving unit, and the second liquid crystal lens unit has the convex lens state being driven and adjusted by the lens driving unit.

18. The display device according to claim 17, wherein the measurement area comprises a light emitting area and a light receiving area, the detecting light transmitter emits detecting light through a detecting light point in the light emitting area, and the detecting light receiver receives reflected detecting light through a detecting light point in the light receiving area;
the measurement area is also disposed with a pixel unit for displaying images, and the pixel unit for displaying images in the measurement area is electrically connected with a screen film transistor driving unit; and
the first liquid crystal lens unit has the flat lens state being driven and adjusted by the lens driving unit and the second liquid crystal lens unit has the flat lens state being driven and adjusted by the lens driving unit.

19. A method for controlling a display panel which comprises a substrate, the substrate comprising a display area and a measurement area that are at least partially overlapped with each other;

the display area is disposed with a pixel unit for displaying images; and the measurement area is disposed with a detecting light transmitter, a detecting light receiver, a first liquid crystal lens unit and a second liquid crystal lens unit, wherein the first liquid crystal lens unit is configured to: switch to a concave lens state in response to activation of a depth information measurement function and diverge light emitted from the detecting light transmitter, and switch to a flat lens state in response to inactivation of the depth information measurement function and cause light emitted from the pixel unit to pass through without being diverged;

the second liquid crystal lens unit is configured to: switch to a convex lens state in response to activation of the depth information measurement function and converge reflected divergent light to the detecting light receiver, and switch to a flat lens state in response to inactivation of the depth information measurement function and cause light emitted from the pixel unit to pass through without being converged, the reflected divergent light being reflected from an external object receiving at least part of the light diverged by the first liquid crystal lens;

the method comprising:

receiving a first trigger instruction;

turning on the detecting light transmitter and the detecting light receiver according to the first trigger instruction as received; and measuring depth information on an external object according to a phase difference between the light emitted from the detecting light transmitter and the light received by the detecting light receiver.

20. The method according to claim 19, wherein the first liquid crystal lens unit and the second liquid crystal lens unit are electrically connected with a lens driving unit; and the first liquid crystal lens unit has the concave lens state being driven and adjusted by the lens driving unit, and the second liquid crystal lens unit has the convex lens state being driven and adjusted by the lens driving unit; the measurement area comprises a light emitting area and a light receiving area, the detecting light transmitter emits detecting light by detecting light point in the light emitting area, and the detecting light receiver receives reflected detecting light by detecting light point in the light receiving area; the measurement area is also disposed with a pixel unit for displaying images, and the pixel unit for displaying images in the measurement area is electrically connected with a screen film transistor driving unit; the first liquid crystal lens unit has the flat lens state being driven and adjusted by the lens driving unit and the second liquid crystal lens unit has the flat lens state being driven and adjusted by the lens driving unit; and the pixel unit for displaying images in the display area is electrically connected with the screen film transistor driving unit;

the method further comprising:

receiving a second trigger instruction;

driving the first liquid crystal lens unit into the flat lens state and driving the second liquid crystal lens unit into the flat lens state, according to the second trigger instruction as received;

driving the pixel unit in the measurement area and the pixel unit in the display area to image.

* * * * *